United States Patent
Koo et al.

(10) Patent No.: US 8,237,464 B2
(45) Date of Patent: Aug. 7, 2012

(54) INTEGRATED CIRCUIT AND METHOD FOR CONTROLLING DATA OUTPUT IMPEDANCE

(75) Inventors: Ja Beom Koo, Seoul (KR); Kwan Weon Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/033,845

(22) Filed: Feb. 24, 2011

(65) Prior Publication Data

US 2012/0007631 A1   Jan. 12, 2012

(30) Foreign Application Priority Data

Jul. 8, 2010 (KR) .................. 10-2010-0066039

(51) Int. Cl.
*H03K 17/16* (2006.01)
*H03K 19/003* (2006.01)

(52) U.S. Cl. ............. 326/30; 326/87; 327/109; 327/333

(58) Field of Classification Search .................. 326/30, 326/82–83, 86–87; 327/108–109, 333
See application file for complete search history.

(56) References Cited

U.S. PATENT DOCUMENTS

| | | | | |
|---|---|---|---|---|
| 7,019,556 B2* | 3/2006 | Yoo | ................................ | 326/30 |
| 7,282,955 B2* | 10/2007 | Kim | ................................ | 326/87 |
| 7,420,387 B2 | 9/2008 | Lee et al. | | |
| 7,576,560 B2* | 8/2009 | Kim | ................................ | 326/30 |
| 7,961,008 B2* | 6/2011 | Kim et al. | ....................... | 326/87 |
| 2004/0217774 A1* | 11/2004 | Choe | ............................... | 326/30 |
| 2005/0040845 A1* | 2/2005 | Park | ............................... | 326/30 |
| 2007/0126467 A1 | 6/2007 | Kim | | |
| 2010/0156455 A1* | 6/2010 | Yang et al. | ....................... | 326/30 |
| 2010/0177578 A1* | 7/2010 | King | ............................. | 365/194 |

* cited by examiner

*Primary Examiner* — Jason M Crawford
(74) *Attorney, Agent, or Firm* — William Park & Associates Ltd.

(57) ABSTRACT

An integrated circuit for controlling data output impedance includes an address decoder, a selection signal decoder, and a transfer control unit. The address decoder is configured to decode an address signal and generate a selection mode signal and a first adjustment mode signal. The selection signal decoder is configured to decode a selection signal and generate an enable signal and a disable signal. The transfer control unit is configured to transfer a pull-up signal and a pull-down signal as a selection pull-up signal and a selection pull-down signal.

20 Claims, 5 Drawing Sheets

INTEGRATED CIRCUIT AND METHOD FOR CONTROLLING DATA OUTPUT IMPEDANCE

CROSS-REFERENCES TO RELATED APPLICATIONS

The present application claims priority under 35 U.S.C 119(a) to Korean Application No. 10-2010-0066039, filed on Jul. 8, 2010, in the Korean intellectual property Office, which is incorporated herein by reference in its entirety.

BACKGROUND

To increase an operating speed, a synchronous memory device has been introduced which can operate in synchronization with a clock. An early type of synchronous memory device is a single data rate (SDR) synchronous memory device which inputs/outputs one data through a single data pin in one clock cycle in synchronization with a rising edge of a clock. However, the SDR synchronous memory device could not sufficiently meet high-speed requirements demanded by the systems. A double data rate (DDR) synchronous memory device, which processes two data in one clock cycle, was then introduced for higher speed operation than a SDR device.

A DDR synchronous memory device successively inputs/outputs two data through each data input/output pin in synchronization with rising and falling edges of an external clock. Without increasing the frequency of a clock, a DDR synchronous memory device can implement at least two times the bandwidth of a conventional SDR synchronous memory device. Hence, a DDR synchronous memory device can perform improved high-speed operations.

For even higher data transfer speeds in a DDR synchronous memory device, several additional concepts were introduced. In the DDR-II synchronous memory specification proposed in the Joint Electron Device Engineering Council (JEDEC), also called the global semiconductor standard organization or the international semiconductor standard council, an Off Chip Driver (OCD) calibration control concept was introduced, according to which the impedance of an OCD configured to output data in the DDR synchronous memory device can be calibrated.

The OCD calibration control is to calibrate the impedance of the OCD to an optimum level in a current system. Thus, to meet the DDR-II synchronous memory specification of the JEDEC, the function of calibrating the impedance of the OCD would be needed additionally.

The OCD calibration control operation proposed in the JEDEC includes an operation of measuring the impedance of an OCD and an operation of calibrating the impedance of an OCD suitably for the current system. Also, since an OCD includes a pull-up driver and a pull-down driver, the operation of measuring the impedance of an OCD is performed in two modes: a Drive1 mode in which the impedance of the pull-up driver outputting high-level data is measured; and a Drive0 mode in which the impedance of the pull-down driver outputting low-level data is measured.

Meanwhile, an On Die Termination (ODT) is a device designed to transfer a data signal to a next chip without impedance mismatching by adjusting a resistance of an output terminal when a memory device is integrated into a board.

Figure 1:
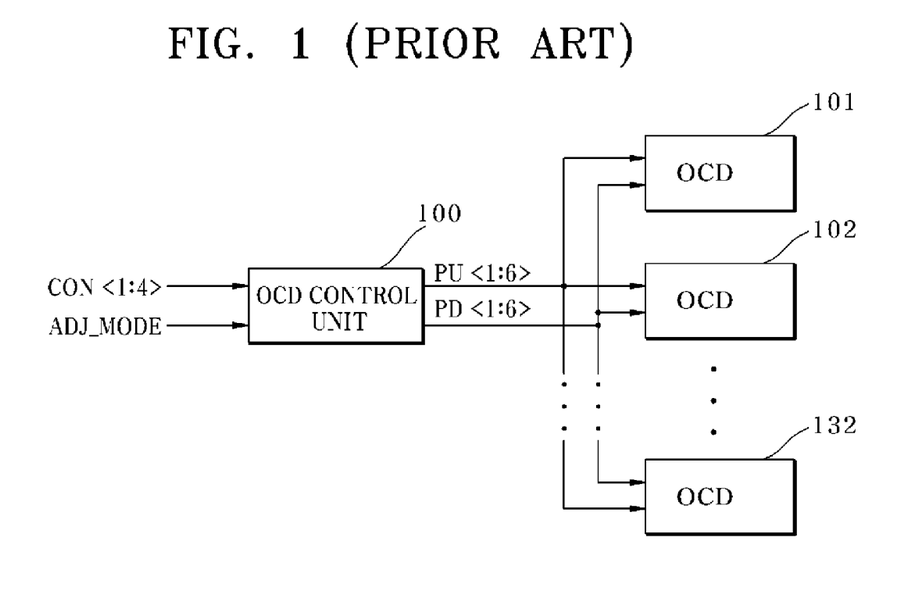
FIG. 1 is a block diagram illustrating a configuration of a conventional data output impedance control circuit.

FIG. 1 shows a conventional data output impedance control circuit in a block diagram.

As illustrated in FIG. 1, the conventional data output impedance control circuit includes an OCD control unit 100 and a plurality of OCDs 101 to 132. The OCD control unit 100 is configured to receive control codes CON<1:4> when an adjustment mode signal ADJ_MODE is at a logic high level, and generate pull-up signals PU<1:6> and pull-down signals PD<1:6>. The OCDs 101 to 132 are configured to receive the pull-up signals PU<1:6> and the pull-down signals PD<1:6> and output data whose impedance is calibrated.

In the conventional data output impedance control circuit having the above-described configuration, since the pull-up signals PU<1:6> and the pull-down signals PD<1:6> are applied to the OCDs 101 to 132 in a batch, the impedances of the OCDs 101 to 132 are equally calibrated.

SUMMARY

An embodiment of the present invention relates to a word line driving circuit which is capable of reducing a leakage current by providing a test mode in which the impedances of only the selected OCDs are calibrated.

In one embodiment, an integrated circuit for controlling data output impedance includes: an address decoder configured to decode an address signal and generate a selection mode signal and a first adjustment mode signal; a selection signal decoder configured to decode a selection signal in response to the selection mode signal and generate an enable signal and a disable signal; and a transfer control unit configured to transfer a pull-up signal and a pull-down signal as a selection pull-up signal and a selection pull-down signal in response to the enable signal, wherein the selection pull-up signal and the selection pull-down signal are signals for driving a driver.

In another embodiment, an integrated circuit for controlling data output impedance includes: a mode signal transfer unit configured to transfer a first adjustment mode signal generated by decoding of an address signal as a second adjustment mode signal in response to a disable signal; a control signal decoder configured to decode a control code in response to the second adjustment mode signal and generate a pull-up signal and a pull-down signal; and a transfer control unit configured to transfer the pull-up signal and the pull-down signal as a first selection pull-up signal and a first selection pull-down signal in response to a first enable signal to calibrate a impedance of a first OCD, and transfer the pull-up signal and the pull-down signal as a second selection pull-up signal and a second selection pull-down signal in response to a second enable signal to calibrate a impedance of a second OCD.

In another embodiment, a data output impedance control method includes: generating a selection mode signal by decoding an address signal having a first combination applied from a memory control circuit; generating an enable signal and a disable signal by decoding a selection signal in response to the selection mode signal; transferring a pull-up signal and a pull-down signal as a selection pull-up signal and a selection pull-down signal in response to the enable signal; and driving a driver by using the selection pull-up signal and the selection pull-down signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes and not intended to limit the scope of the invention.

Figure 2:
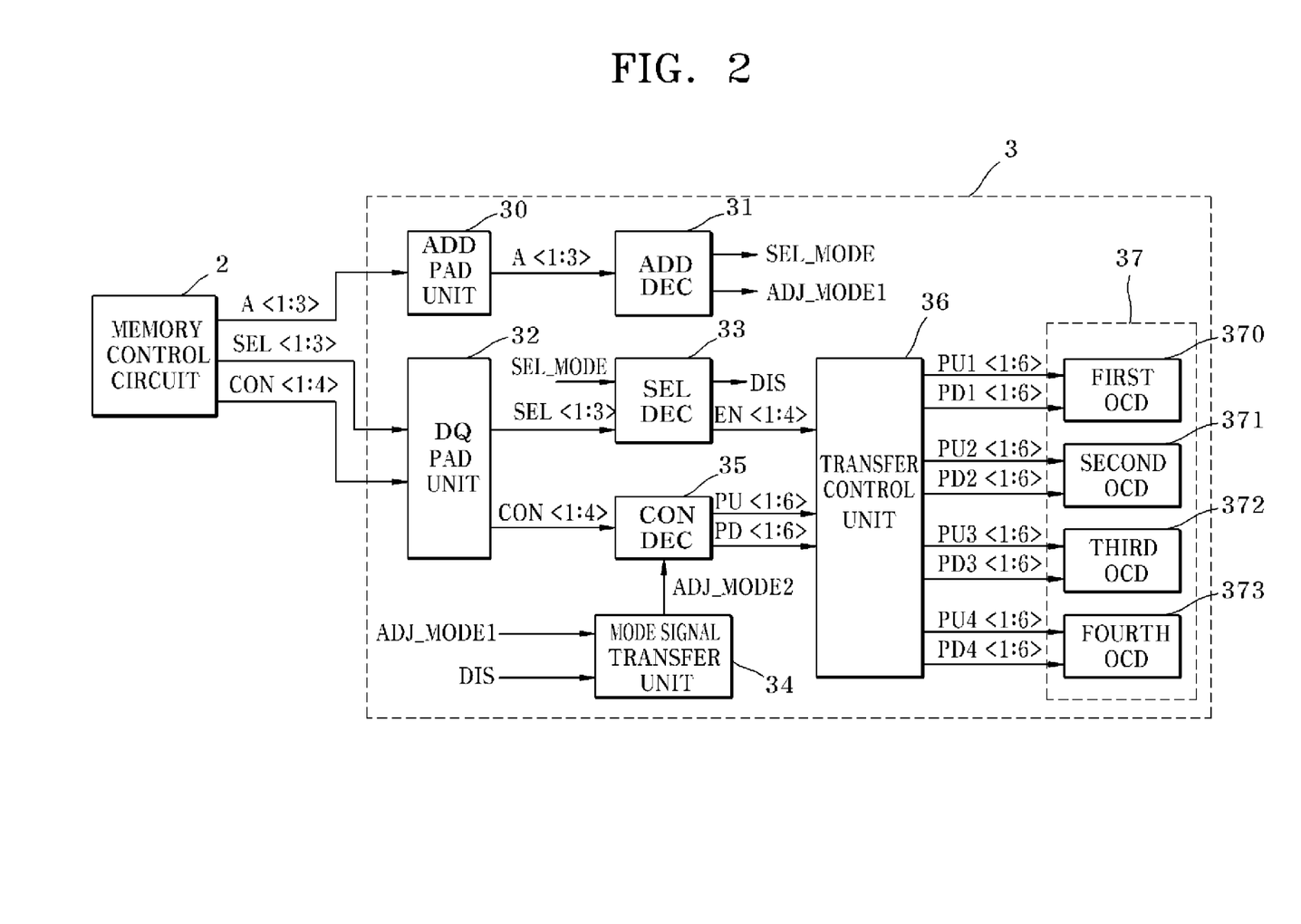
FIG. 2 is a block diagram illustrating a configuration of an integrated circuit which is capable of controlling data output impedance according to an embodiment of the present invention.

FIG. 2 is a block diagram illustrating a configuration of an integrated circuit capable of controlling data output impedance according to an embodiment of the present invention.

As illustrated in FIG. 2, the integrated circuit according to an embodiment of the present invention includes a memory control circuit 2 and a data output impedance control circuit 3. The memory control circuit 2 is configured to apply first to third address signals A<1:3>, first to third selection signals SEL<1:3>, and first to fourth control codes CON<1:4> to the data output impedance control circuit 3 from, for example, a circuit outside a semiconductor memory device. The data output impedance control circuit 3 is provided within the semiconductor memory device and configured to receive the first to third address signals A<1:3>, the first to third selection signals SEL<1:3>, and the first to fourth control codes CON<1:4> and control the data output impedance. The data output impedance control circuit 3 includes an address pad unit 30, an address decoder 31, a DQ pad unit 32, a selection signal decoder 33, a mode signal transfer unit 34, a control code decoder 35, a transfer control unit 36, and an OCD unit 37.

The address decoder 31 is configured to decode the first to third address signals A<1:3> applied from the memory control circuit 2 through the address pad unit 30 including a plurality of address pads (not shown), and generate a selection mode signal SEL_MODE and a first adjustment mode signal ADJ_MODE1, which are enabled to a high level (in some embodiments, a low level). The logic level combination of the first to third address signals A<1:3> which enables the selection mode signal SEL_MODE or the first adjustment mode signal ADJ_MODE1 to a high level may be set in various manners according to the requirements of embodiments.

The selection signal decoder 33 is driven when the selection mode signal SEL_MODE is at a high level. The selection signal decoder 33 is configured to decode the first to third selection signals SEL<1:3> applied from the memory control circuit 2 through the DQ pad unit 32 including a plurality of DQ pads (not shown), and generate a disable signal DIS and first to fourth enable signals EN<1:4>. The logic level combination of the first to third selection signals SEL<1:3> which enables the first to fourth enable signals EN<1:4> or the disable signal DIS to a high level (in some embodiments, a low level) may be set in various manners according to the requirements of embodiments. For example, the first to fourth enable signals EN<1:4> and the disable signal DIS outputted by the selection signal decoder based on the inputted signals of first to third selection signals SEL<1:3> according to an embodiment of the present invention can be set as shown in Table 1 below.

TABLE 1

| SEL<1> | SEL<2> | SEL<3> | EN<1> | EN<2> | EN<3> | EN<4> | DIS |
|---|---|---|---|---|---|---|---|
| L | L | L | L | L | L | L | H |
| H | L | L | H | L | L | L | L |
| L | H | L | L | H | L | L | L |
| H | H | L | L | L | H | L | L |
| L | L | H | L | L | L | H | L |

Figure 3:
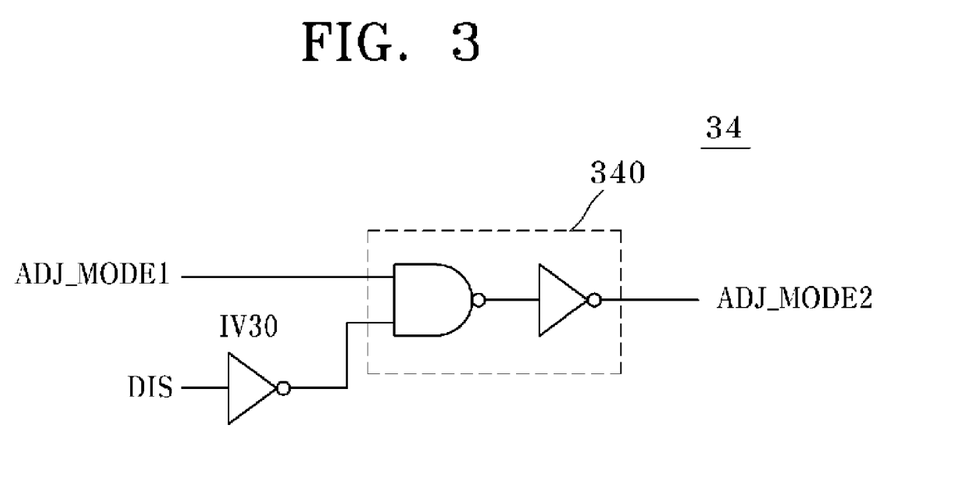
FIG. 3 is a circuit diagram illustrating a mode signal transfer unit included in the integrated circuit of FIG. 2.

As illustrated in FIG. 3, the mode signal transfer unit 34 includes an inverter IV30 and a logic section 340. The inverter IV30 is configured to invert and buffer the disable signal DIS. The logic section 340 is configured to performs an AND operation on the first adjustment mode signal ADJ_MODE1 and an output signal of the inverter IV30 and generate a second adjustment mode signal ADJ_MODE2. The mode signal transfer unit 34 having the above-described configuration transfers the first adjustment mode signal ADJ_MODE1 as the second adjustment mode signal ADJ_MODE2 when the disable signal DIS is at a low level, and outputs the second adjustment mode signal ADJ_MODE2 disabled to a low level, regardless of the first adjustment mode signal ADJ_MODE1, when the disable signal DIS is at a high level.

The control code decoder 35 is driven when the second adjustment mode signal ADJ_MODE2 is at a high level. The control code decoder 35 is configured to decode the first to fourth control codes CON<1:4> applied from the memory control circuit 2 through the DQ pad unit 32, and generate the first to sixth pull-up signals PU<1:6> and the first to sixth pull-down signals PD<1:6>.

Figure 4:
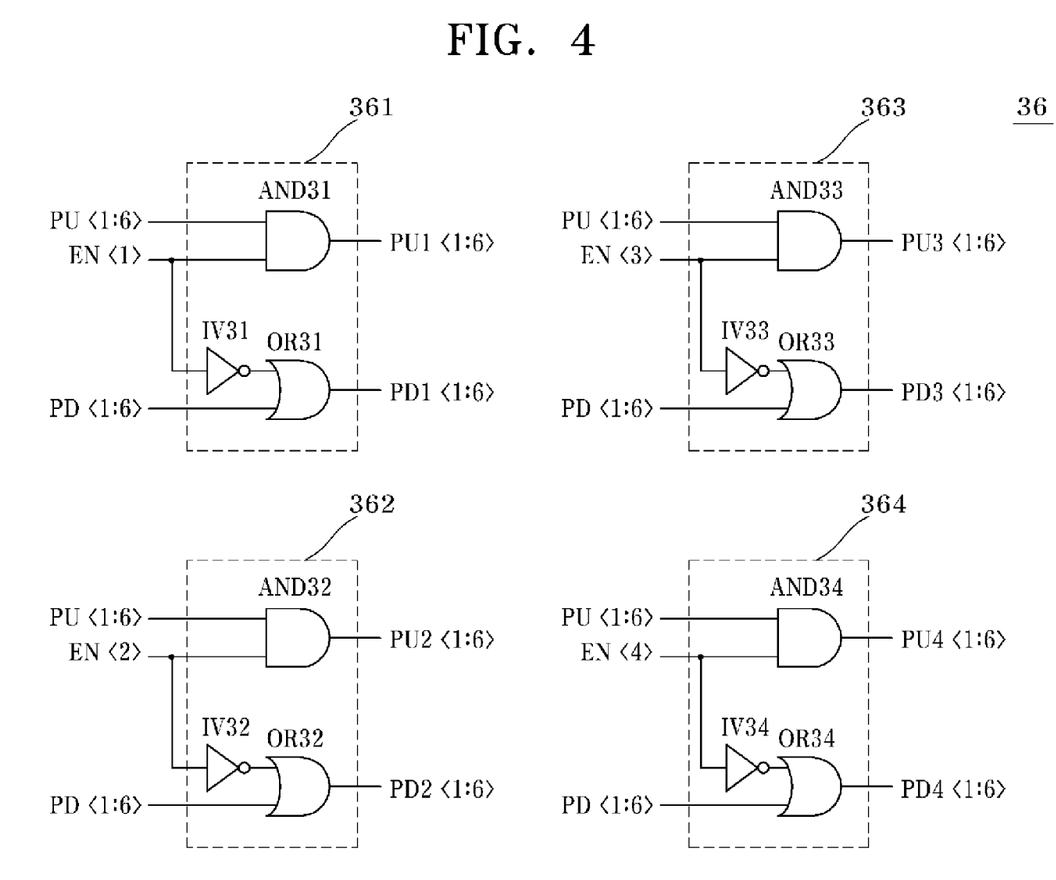
FIG. 4 is a circuit diagram illustrating a transfer control unit included in the integrated circuit of FIG. 2.

As illustrated in FIG. 4, the transfer control unit 36 includes first to fourth transfer control sections 361 to 364.

The first transfer control section 361 includes an AND gate AND31, an inverter IV31, and an OR gate OR31. The AND gate AND31 is configured to perform an AND operation on the first to sixth pull-up signals PU<1:6> and the first enable signal EN<1> and output first selection pull-up signals PU1<1:6>. The inverter IV31 is configured to invert and buffer the first enable signal EN<1>. The OR gate OR31 is configured to perform an OR operation on the first to sixth pull-down signals PD<1:6> and an output signal of the inverter IV31 and output first selection pull-down signals PD1<1:6>. When the first enable signal EN<1> is at a high level, the first transfer control section 361 having the above-described configuration transfers the first to sixth pull-up signals PU<1:6> and the first to sixth pull-down signals PD<1:6> as the first selection pull-up signals PU1<1:6> and the first selection pull-down signals PD1<1:6>. Also, when the first enable signal EN<1> is at a low level, the first transfer control section 361 outputs the first selection pull-up signals PU1<1:6>, all of which are disabled to a high level, and the first selection pull-down signals PD1<1:6>, all of which are disabled to a low level.

The second transfer control section 362 includes an AND gate AND32, an inverter IV32, and an OR gate OR32. The AND gate AND32 is configured to perform an AND operation on the first to sixth pull-up signals PU<1:6> and the second enable signal EN<2> and output second selection pull-up signals PU2<1:6>. The inverter IV32 is configured to invert and buffer the second enable signal EN<2>. The OR gate OR32 is configured to perform an OR operation on the first to sixth pull-down signals PD<1:6> and an output signal of the inverter IV32 and output second selection pull-down signals PD2<1:6>. When the second enable signal EN<2> is at a high level, the second transfer control section 362 having the above-described configuration transfers the first to sixth pull-up signals PU<1:6> and the first to sixth pull-down signals PD<1:6> as the second selection pull-up signals PU2<1:6> and the second selection pull-down signals PD2<1:6>. Also, when the second enable signal EN<2> is at a low level, the second transfer control section 362 outputs the second selection pull-up signals PU2<1:6>, all of which are disabled to a high level, and the second selection pull-down signals PD2<1:6>, all of which are disabled to a low level.

The third transfer control section 363 includes an AND gate AND33, an inverter IV33, and an OR gate OR33. The AND gate AND33 is configured to perform an AND operation on the first to sixth pull-up signals PU<1:6> and the third enable signal EN<3> and output third selection pull-up signals PU3<1:6>. The inverter IV33 is configured to invert and buffer the third enable signal EN<3>. The OR gate OR33 is configured to perform an OR operation on the first to sixth pull-down signals PD<1:6> and an output signal of the inverter IV33 and output third selection pull-down signals PD3<1:6>. When the third enable signal EN<3> is at a high level, the third transfer control section 363 having the above-described configuration transfers the first to sixth pull-up signals PU<1:6> and the first to sixth pull-down signals PD<1:6> as the third selection pull-up signals PU3<1:6> and the third selection pull-down signals PD3<1:6>. Also, when the third enable signal EN<3> is at a low level, the third transfer control section 363 outputs the third selection pull-up signals PU3<1:6>, all of which are disabled to a high level, and the third selection pull-down signals PD3<1:6>, all of which are disabled to a low level.

The fourth transfer control section 364 includes an AND gate AND34, an inverter IV34, and an OR gate OR34. The AND gate AND34 is configured to perform an AND operation on the first to sixth pull-up signals PU<1:6> and the fourth enable signal EN<4> and output fourth selection pull-up signals PU4<1:6>. The inverter IV34 is configured to invert and buffer the fourth enable signal EN<4>. The OR gate OR34 is configured to perform an OR operation on the first to sixth pull-down signals PD<1:6> and an output signal of the inverter IV34 and output fourth selection pull-down signals PD4<1:6>. When the fourth enable signal EN<4> is at a high level, the fourth transfer control section 364 having the above-described configuration transfers the first to sixth pull-up signals PU<1:6> and the first to sixth pull-down signals PD<1:6> as the fourth selection pull-up signals PU4<1:6> and the fourth selection pull-down signals PD4<1:6>. Also, when the fourth enable signal EN<4> is at a low level, the third transfer control section 364 outputs the fourth selection pull-up signals PU4<1:6>, all of which are disabled to a high level, and the fourth selection pull-down signals PD4<1:6>, all of which are disabled to a low level.

Referring back to FIG. 2, the OCD unit 37 includes first to fourth OCDs 370 to 373.

The first OCD 370 is configured to receive the first selection pull-up signals PU1<1:6> and the first selection pull-down signals PD1<1:6> and control the data output impedance. As described above, the first selection pull-up signals PU1<1:6> and the first selection pull-down signals PD1<1:6> are generated from the first to sixth pull-up signals PU<1:6> and the first to sixth pull-down signals PD<1:6> when the first enable signal EN<1> is at a high level, and all of the first selection pull-up signals PU1<1:6> and the first selection pull-down signals PD1<1:6> are disabled when the first enable signal EN<1> is at a low level.

The second OCD 371 is configured to receive the second selection pull-up signals PU2<1:6> and the second selection pull-down signals PD2<1:6> and control the data output impedance. As described above, the second selection pull-up signals PU2<1:6> and the second selection pull-down signals PD2<1:6> are generated from the first to sixth pull-up signals PU<1:6> and the first to sixth pull-down signals PD<1:6> when the second enable signal EN<2> is at a high level, and all of the second selection pull-up signals PU2<1:6> and the second selection pull-down signals PD2<1:6> are disabled when the second enable signal EN<2> is at a low level.

The third OCD 372 is configured to receive the third selection pull-up signals PU3<1:6> and the third selection pull-down signals PD3<1:6> and control the data output impedance. As described above, the third selection pull-up signals PU3<1:6> and the third selection pull-down signals PD3<1:6> are generated from the first to sixth pull-up signals PU<1:6> and the first to sixth pull-down signals PD<1:6> when the third enable signal EN<3> is at a high level, and all of the third selection pull-up signals PU3<1:6> and the third selection pull-down signals PD3<1:6> are disabled when the third enable signal EN<3> is at a low level.

The fourth OCD 373 is configured to receive the fourth selection pull-up signals PU4<1:6> and the fourth selection pull-down signals PD4<1:6> and control the data output impedance. As described above, the fourth selection pull-up signals PU4<1:6> and the fourth selection pull-down signals PD4<1:6> are generated from the first to sixth pull-up signals PU<1:6> and the first to sixth pull-down signals PD<1:6> when the fourth enable signal EN<4> is at a high level, and all of the fourth selection pull-up signals PU4<1:6> and the fourth selection pull-down signals PD4<1:6> are disabled when the fourth enable signal EN<4> is at a low level.

Figure 5:
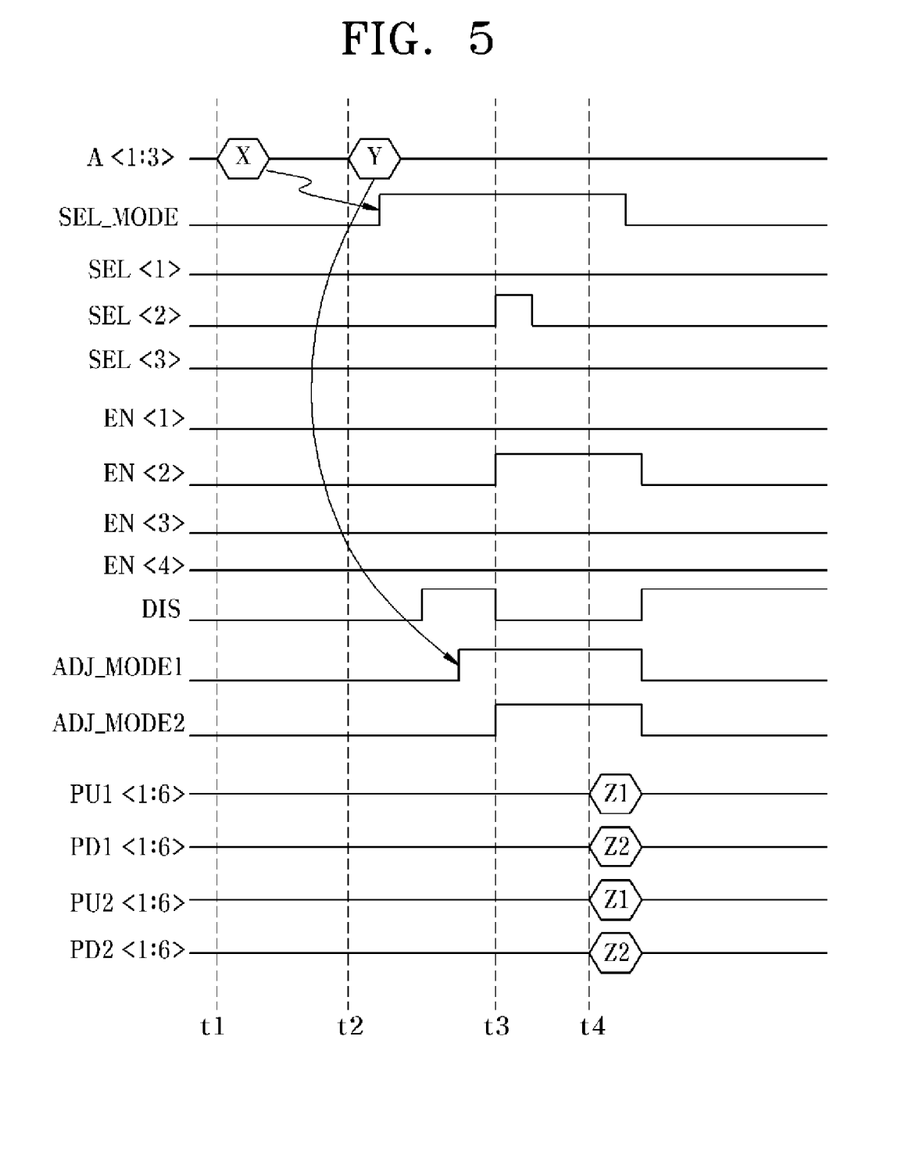
FIG. 5 is a timing diagram illustrating the operation of the integrated circuit according to the embodiment of the present invention.

The operation of the integrated circuit according to the embodiment of the present invention, which can control the data output impedance, will be described below in detail with reference to FIG. 5.

When the first to third address signals A<1:3> having a logic level combination X is inputted at time t1, the selection mode signal SEL_MODE is enabled to a high level. The selection signal decoder 33 is driven in response to the high-level selection mode signal SEL_MODE, and generates the disable signal DIS and the first to fourth enable signals EN<1:4> by decoding the first to third selection signals SEL<1:3> inputted from the memory control circuit 2 through the DQ pad unit 32. Since all of the first to third selection signals SEL<1:3> are at a low level at a timing when the selection mode signal SEL_MODE changes to a high level, the disable signal DIS is enabled to a high level and all of the first to fourth enable signals EN<1:4> are disabled to a low level. In such a state that the selection mode signal SEL_MODE maintains a high level, the second enable signal EN<2> is enabled to a high level when the second selection signal SEL<2> changes to a high level at time t3.

Meanwhile, when the first to third address signals A<1:3> having a logic level combination Y is inputted at time t2, the first adjustment mode signal ADJ_MODE1 is enabled to a high level. The mode signal transfer unit 34 transfers the first adjustment mode signal ADJ_MODE1 as the second adjustment mode signal ADJ_MODE2 at time t3 when the disable signal DIS changes to a low level. Therefore, the second adjustment mode signal ADJ_MODE2 changes to a high level at time t3.

Then, the control code decoder 35 receiving the first to fourth control codes CON<1:4> applied from the memory control circuit 2 through the DQ pad unit 32 generates the first to sixth pull-up signals PU<1:6> and the first to sixth pull-down signals PD<1:6> by decoding the first to fourth control codes CON<1:4> at time t4.

Since only the second enable signal EN<2> among the first to fourth enable signals EN<1:4> is enabled to a high level, the first to sixth pull-up signals PU<1:6> and the first to sixth pull-down signals PD<1:6> are transferred as the second selection pull-up signals PU2<1:6> and the second selection pull-down signals PD2<1:6>. Therefore, the data output impedance of the second OCD 371 is controlled. At this time, since the first selection pull-up signals PU1<1:6>, the first selection pull-down signals PD1<1:6>, the third selection pull-up signals PU3<1:6>, the third selection pull-down signals PD3<1:6>, the fourth selection pull-up signals PU4<1:6>, and the fourth selection pull-down signals PD4<1:6> are all outputted in a disabled state, the data output impedances of the first OCD 370, the third OCD 371, and the fourth OCD 372 are not controlled.

As described above, the integrated circuit according to the embodiment of the present invention can control the data output impedances of the first to fourth OCDs 370 to 373 included in the OCD unit 37 selectively, not in a batch. Thus, only the driver selected among the first to fourth OCDs 370 to 373 is driven, and the remaining drivers are not driven, thereby reducing the power dissipation. Moreover, it is possible to control the driving ability of the driver selected by the first to sixth pull-up signals PU<1:6> and the first to sixth pull-down signals PD<1:6> generated by decoding the first to fourth control codes CON<1:4> applied from the memory control circuit 2.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An integrated circuit for controlling data output impedance, the integrated circuit comprising:
    an address decoder configured to decode an address signal and generate a selection mode signal and a first adjustment mode signal;
    a selection signal decoder configured to decode a selection signal in response to the selection mode signal and generate an enable signal and a disable signal; and
    a transfer control unit configured to transfer a pull-up signal and a pull-down signal as a selection pull-up signal and a selection pull-down signal in response to the enable signal,
    wherein the selection pull-up signal and the selection pull-down signal are signals for driving a driver.

2. The integrated circuit of claim 1, wherein the address signal is applied from a memory control circuit through an address pad unit.

3. The integrated circuit of claim 1, wherein the selection signal is applied from a memory control circuit through a DQ pad unit in response to the selection mode signal.

4. The integrated circuit of claim 1, further comprising a mode signal transfer unit configured to transfer the first adjustment mode signal as a second adjustment mode signal in response to the disable signal.

5. The integrated circuit of claim 4, further comprising a control signal decoder configured to decode a control code in response to the second adjustment mode signal and generate the pull-up signal and the pull-down signal.

6. The integrated circuit of claim 5, wherein the control code is applied from a memory control circuit through a DQ pad unit.

7. The integrated circuit of claim 1, wherein the transfer control unit comprises:
    a first transfer control section configured to transfer the pull-up signal and the pull-down signal as a first selection pull-up signal and a first selection pull-down signal in response to a first enable signal; and
    a second transfer control section configured to transfer the pull-up signal and the pull-down signal as a second selection pull-up signal and a second selection pull-down signal in response to a second enable signal.

8. The integrated circuit of claim 7, wherein the first selection pull-up signal and the first selection pull-down signal are set to a disabled state when the first enable signal is disabled, and the second selection pull-up signal and the second pull-down signal are set to a disabled state when the second enable signal is disabled.

9. The integrated circuit of claim 7, further comprising:
    a first OCD whose impedance is calibrated in response to the first selection pull-up signal and the first selection pull-down signal; and
    a second OCD whose impedance is calibrated in response to the second selection pull-up signal and the second selection pull-down signal.

10. An integrated circuit for controlling data output impedance, the integrated circuit comprising:
    A mode signal transfer unit configured to transfer a first adjustment mode signal generated by decoding of an address signal as a second adjustment mode signal in response to a disable signal;
    A control signal decoder configured to decode a control code in response to the second adjustment mode signal and generate a pull-up signal and a pull-down signal; and
    A transfer control unit configured to transfer the pull-up signal and the pull-down signal as a first selection pull-up signal and a first selection pull-down signal in response to a first enable signal to calibrate a impedance of a first OCD, and transfer the pull-up signal and the pull-down signal as a second selection pull-up signal and a second selection pull-down signal in response to a second enable signal to calibrate a impedance of a second OCD.

11. The integrated circuit of claim 10, further comprising:
    a selection signal decoder configured to decode a selection signal in response to a selection mode signal generated by decoding of the address signal, and generate the first and second enable signal and the disable signal.

12. A data output impedance control method comprising:
    generating a selection mode signal by decoding an address signal having a first combination applied from a memory control circuit;
    generating an enable signal and a disable signal by decoding a selection signal in response to the selection mode signal;
    transferring a pull-up signal and a pull-down signal as a selection pull-up signal and a selection pull-down signal in response to the enable signal; and
    driving a driver by using the selection pull-up signal and the selection pull-down signal.

13. The data output impedance control method of claim 12, wherein the address signal is inputted through an address pad unit.

14. The data output impedance control method of claim 12, wherein the selection signal is inputted from a memory control circuit through a DQ pad unit in response to the selection mode signal.

15. The data output impedance control method of claim 12, further comprising generating a first adjustment mode signal by decoding an address signal having a second combination applied from the memory control circuit.

16. The data output impedance control method of claim 15, further comprising transferring the first adjustment mode signal as a second adjustment mode signal in response to the enable signal.

17. The data output impedance control method of claim 16, further comprising generating the pull-up signal and the pull-down signal by decoding a control code in response to the second adjustment mode signal.

18. The data output impedance control method of claim 17, wherein the control code is inputted from a memory control circuit through a DQ pad unit including a plurality of DQ pads.

19. The data output impedance control method of claim 12, wherein the pull-up signal and the pull-down signal are transferred as a first selection pull-up signal and a first selection pull-down signal in response to a first enable signal, and the pull-up signal and the pull-down signal are transferred as a second selection pull-up signal and a second selection pull-down signal in response to a second enable signal.

20. The data output impedance control method of claim 19, wherein an impedance of a first OCD is controlled in response to the first selection pull-up signal and the first selection pull-down signal, and an impedance of a second OCD is controlled in response to the second selection pull-up signal and the second selection pull-down signal.

* * * * *